(12) United States Patent
Shin et al.

(10) Patent No.: US 6,280,525 B1
(45) Date of Patent: Aug. 28, 2001

(54) APPARATUS FOR MANUFACTURING SILICA FILM

(75) Inventors: Dong-wook Shin, Suwon; Sun-tae Jung, Seoul, both of (KR)

(73) Assignee: Samsung Electronics Co., Ltd., Suwon (KR)

(*) Notice: Subject to any disclaimer, the term of this patent is extended or adjusted under 35 U.S.C. 154(b) by 0 days.

(21) Appl. No.: 09/104,984

(22) Filed: Jun. 26, 1998

(30) Foreign Application Priority Data

Jun. 27, 1997 (KR) .................................................. 97-28145
Jul. 15, 1997 (KR) .................................................. 97-32888

(51) Int. Cl.$^7$ ................................................ C23C 16/00
(52) U.S. Cl. ............................................................ 118/715
(58) Field of Search .......................................... 118/715 T

(56) References Cited

U.S. PATENT DOCUMENTS

| | | | |
|---|---|---|---|
| 5,116,640 | 5/1992 | Mikami et al. | .................... 427/66 |
| 5,174,881 * | 12/1992 | Iwasaki et al. | ................ 204/298.25 |
| 5,593,741 * | 1/1997 | Ikeda | ............................. 427/579 |
| 5,667,547 * | 9/1997 | Christiansen et al. | .......... 65/17.4 |
| 5,776,254 * | 7/1998 | Yuuki et al. | ..................... 118/715 |
| 5,863,604 * | 1/1999 | Hunt et al. | ...................... 427/248.1 |

FOREIGN PATENT DOCUMENTS 1260233   1/1972   (GB) .

* cited by examiner

*Primary Examiner*—Terrel Morris
*Assistant Examiner*—Norca L. Torres
(74) *Attorney, Agent, or Firm*—Leydig, Voit & Mayer, Ltd.

(57) ABSTRACT

An apparatus for manufacturing a silica film is provided. The apparatus includes a conveyor including a mounting unit where a plurality of wafers are loaded. The conveyor is used for moving and transferring the mounting wafers. The apparatus also includes a deposition part for generating flames to deposit silica soot on the plurality of wafers, the deposition part being located above the conveyor, and a calcination part, adjacent to the deposition part, removing water from the silica soot, and a sintering part, adjacent to the calcination part, for deifying the calcined silica soot to form a silica film. The process of manufacturing the silica film can be continuously performed, enhancing productivity.

5 Claims, 3 Drawing Sheets

US 6,280,525 B1

APPARATUS FOR MANUFACTURING SILICA FILM

BACKGROUND OF THE INVENTION

1. Field of the Invention

The present invention relates to an apparatus for manufacturing a silica film used for manufacturing an optical device, and a method for manufacturing a silica film using the same. More particularly, the invention relates to an apparatus for manufacturing a silica film using a flame hydrolysis deposition method and a method for manufacturing a silica film using the same.

2. Description of the Related Art

A silica film is used in various typical optical devices. The silica film is formed by a chemical vapor deposition method or a flame hydrolysis deposition method. The flame hydrolysis deposition method is more common, since it has a high deposition rate and thus ensures high productivity. In particular, in the flame hydrolysis deposition method, about twenty 4-inch Si wafers are mounted on a round plate and then the plate is rotated. Subsequently, a torch, in which a flame is formed by a supplied material to generate silica, is reciprocated in a straight line from the center of the plate where the silicon substrate (silicon wafer) is mounted to the edge, to thereby uniformly deposit the silica.

However, by the flame hydrolysis deposition method, each batch consists of twenty wafers. Thus the production must be stopped between batches, reducing the productivity.

SUMMARY OF THE INVENTION

To solve the above problem, it is an objective of the present invention to provide an apparatus for manufacturing a silica film, having high productivity.

It is another objective of the present invention to provide a method for manufacturing a silica film using the apparatus.

Accordingly, to achieve the first objective, there is provided an apparatus for manufacturing a silica film including: a conveyor including a mounting unit where a plurality of wafers are loaded, for moving transferring the mounted wafers; a deposition part for generating flames to deposit silica soot on the plurality of wafers, and being located above the conveyor; a calcination part, adjacent to the deposition part, for removing water from the silica soot; and a sintering part, adjacent to the calcination part, for densifying the calcined silica soot to form a silica film.

The mounting unit is formed on the surface of the conveyor, as wafer shaped depressions. The conveyor includes one, selected from the group consisting of $Al_2O_3$, mullite, SiC, anode-oxidized $Al_2$ $O_3$ and anode-oxidized tungsten. The deposition part includes a plurality of torches for supplying a gaseous material to form flames and a transfer device for moving the torch.

To achieve the second objective, there is provided a method for manufacturing a silica film, comprising the steps of: (a) loading a plurality of wafers on a mounting unit of a conveyor, using mounting means; (b) moving the plurality of loaded wafers with the conveyor to a deposition part to deposit silica soot on the plurality of wafers; (c) moving the wafers with the conveyor from the deposition part to a calcination part to remove water from the silica soot; and (d) moving the wafers using the conveyor from the calcination part to a sintering part to densify the silica soot and form a silica film.

The water is removed from the silica soot at 700° C. for approximately 30 min. The silica soot is densified at 1250~1300° C. for 2~3 hours. The silica soot is formed by a flame hydrolysis deposition method. The surface of the silica film can be polished after step (d) of forming the silica film. The surface of the silica film is polished using one method selected from the group consisting of mechanical polishing, chemical polishing and chemical mechanical polishing.

According to the apparatus for manufacturing a silica film of the present invention, the process of manufacturing the silica film can be continuously performed, to thereby enhance productivity. Also, the processed wafer is not exposed to air after depositing the silica soot, to thereby suppress any deterioration of the silica film due to contamination and water.

BRIEF DESCRIPTION OF THE DRAWINGS

The above objectives and advantages of the present invention will become more apparent by describing in detail a preferred embodiment thereof with reference to the attached drawings in which.

DESCRIPTION OF THE PREFERRED EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Figure 1:
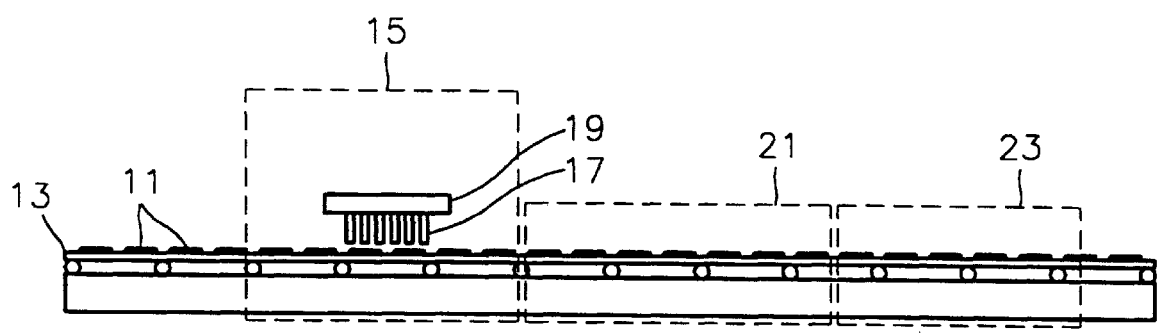
FIG. 1 is a schematic view showing an apparatus for manufacturing a silica film according to the present invention.

Referring to FIG. 1, the apparatus for manufacturing a silica film according to the present invention includes a conveyor 13, including a mounting unit capable of loading a plurality of wafers 11. The conveyer 13 is capable of moving the loaded wafers 11 according to a predetermined production capacity. The mounting unit includes wafer-shaped depressions in the surface of the conveyor 13, where the wafers 11 are to be mounted. The conveyor 13 passes pass through a subsequent high temperature process, so the conveyor 13 is preferably formed of a refractory material, e.g., ceramic such as $Al_2O_3$, mullite or SiC, or a refractory metallic material such as anode-oxidized $Al_2O_3$ and anode-oxidized tungsten. The refractory metallic material is not flexible, and thus includes an articulation or joining structure.

Also, the apparatus for manufacturing a silica film according to the present invention includes a deposition part 15 for depositing silica soot on the wafers by the flame hydrolysis deposition method, the wafers being located on the conveyor 13. The deposition part 15 includes a torch 17 in which a gaseous material is supplied to create a flame and a transfer device 19 for moving of the torch 17. The torch 17 can move linearly and/or perpendicular to the direction of movement of the wafer 11. Three or more torches are mounted to enhance the uniformity of deposition.

The apparatus for manufacturing a silica film of the present invention also includes a calcination part 21 capable of removing water from the deposited silica soot, the calcination part being adjacent to the deposition part 15, and a sintering part 23 for densifying the calcined silica soots to form a silica film. The calcination part 21 and the sintering part 23 are formed as a tunnel type furnace, and the wafer 11 stays in each for a predetermined time at a high temperature. As a result, the apparatus for manufacturing a silica film of the present invention can continuously perform the process of manufacturing the silica film, unlike the conventional art, to thereby increase productivity.

Figure 2:
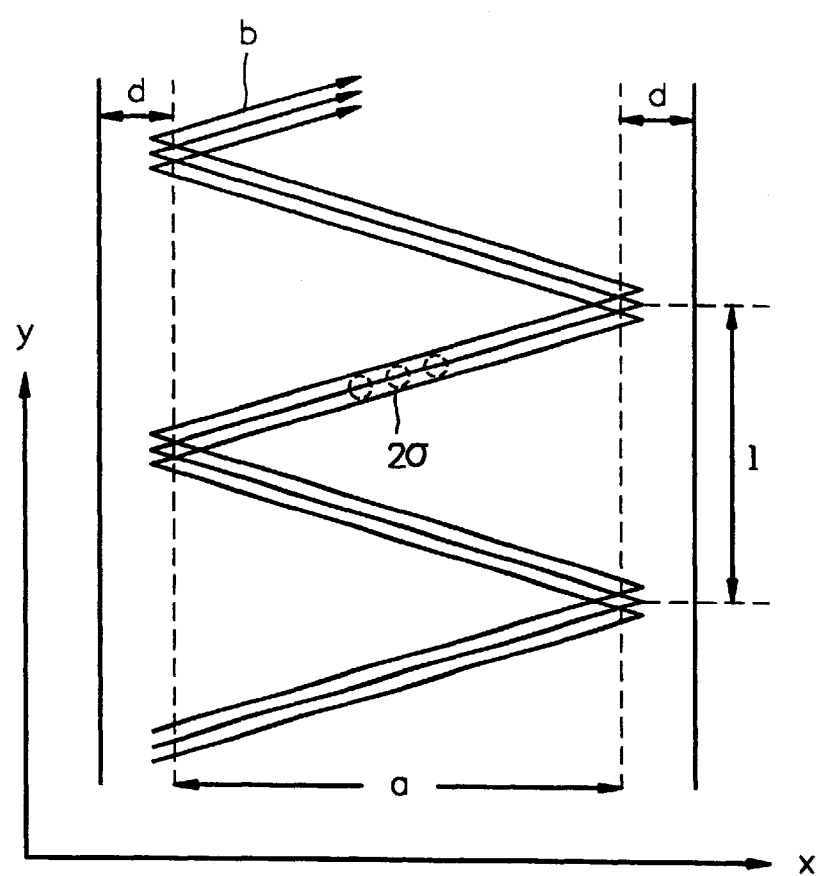
FIG. 2 is a diagram illustrating a torch movement path of a deposition part of FIG. 1.
Figure 3:
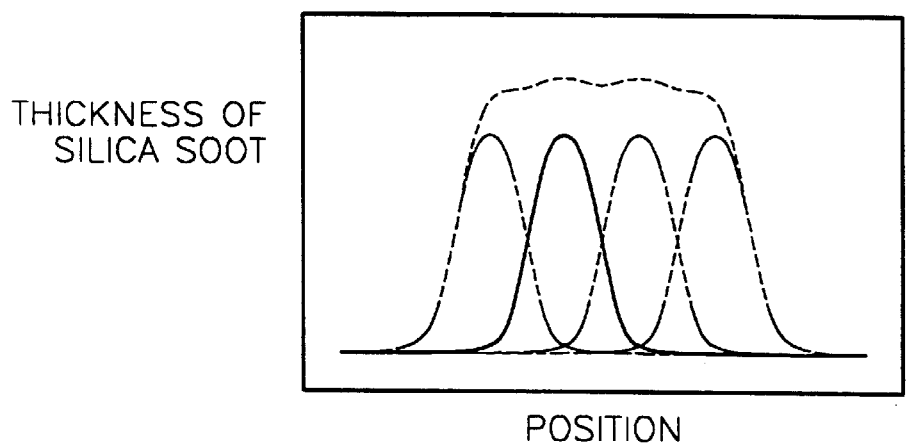
FIG. 3 is a diagram showing distribution of the thickness of silica soots in accordance with the torch movement path of FIG. 2.
Figure 4:
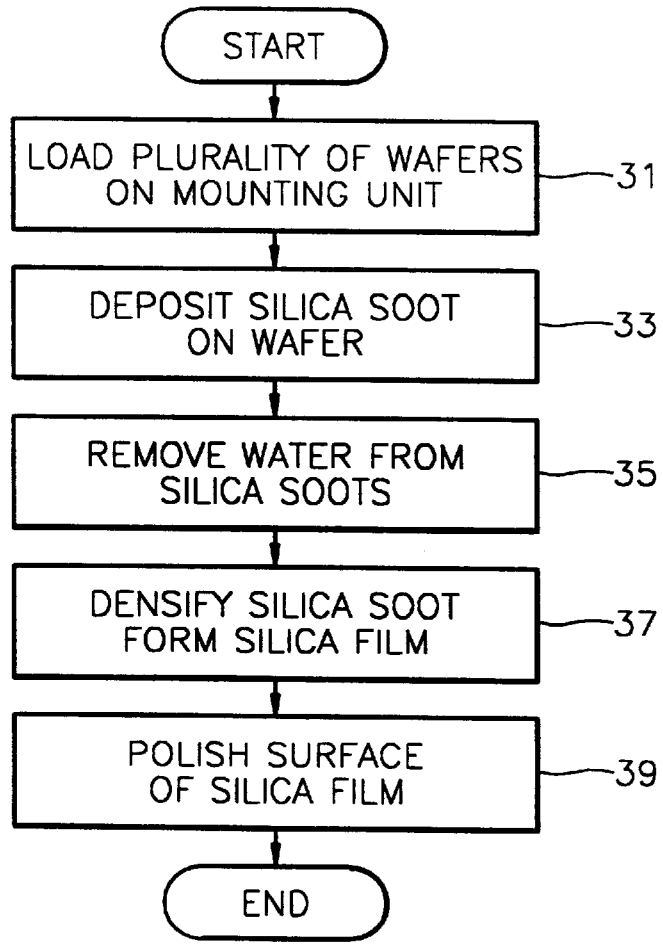
FIG. 4 is a flowchart illustrating a method for manufacturing a silica film using the apparatus of FIG. 1.

The movement path of a torch of a deposition part and distribution of the thickness of silica soot thereof will be described with reference to FIGS. 2 and 3.

In detail, the conveyor of FIG. 1 moves in the direction of Y at a constant speed, and the torch is periodically reciprocated in the direction of X, over a distance a. At this time, the torch 17 traces a sawtooth path. The distribution of the silica soot sprayed from the torch is Gaussian. When the standard deviation of the Gaussian distribution is $\sigma$, a minimum difference between the center of the torch and that of the next torch of approximately $2\sigma$ is most preferable for uniform deposition. Thus, the number of torches required for uniform deposition is $1/2\sigma$. So, the density of silica soot in an area of width d where movement paths of the torch 17 overlap, is different from that in the other regions, so wafers must not be located on the area d.

Meanwhile, important factors for determining the deposition rate and uniformity are the size of the torch, and velocity ratio of a wafer transfer device and a torch in the directions of x and y. The velocity of the wafer is determined by considering the process time of calcination part, sintering part and deposition part. Also, as shown in FIG. 3, as the standard deviation of the silica soot distribution becomes smaller, the thickness deviation of the deposited silica soot becomes smaller. Thus, preferably, the aperture of the torch is reduced as small as possible; but if it is too small, more torches must be mounted.

Figure 5:
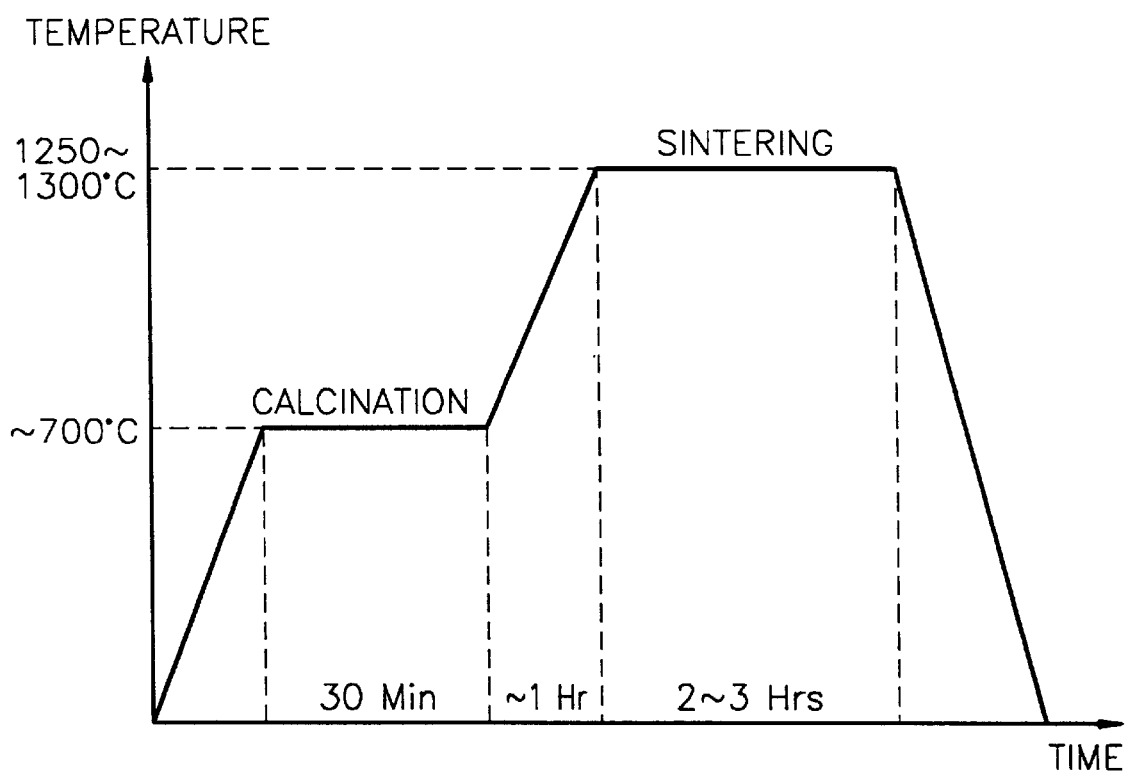
FIG. 5 is a graph of temperature distribution when the wafer passes through a calcination part and a sintering part of the apparatus for manufacturing a silica film of FIG. 1.

According to the method for manufacturing a silica film of the present invention, a plurality of wafers are loaded on the mounting unit of the conveyor 13 using mounting means (step 31). Subsequently, the plurality of wafers are moved to the deposition part 15 using the conveyor 13 to deposit silica soot on the plurality of wafers using flame hydrolysis deposition (step 33). The wafers are moved from the deposition part 15 to the calcination part 21 using the conveyor 13, to remove water from the silica soot (step 35). The water of the silica soot is removed at approximately 700° C. for approximately 30 min as shown in FIG. 5. The wafers are moved from the calcination part 21 to the sintering part 23 using the conveyor 13, and the silica soot is densified to form a silica film (step 37). The silica soot is densified in the sintering part 23 at 1250~1300° C. for approximately 2~3 hours as shown in FIG. 5. The wafers in the calcination part 21 and the sintering part 23 must be processed at a constant temperature gradient to reduce thermal impact on the wafers.

Then, a surface is polished in order to planarize the silica film if necessary (step 39). The surface of the silica film is polished using mechanical, chemical or chemical-mechanical polishing. The mechanical polishing physically removes a little of the surface of the silica film by abrasion, using a material harder than the surface of the silica film. The chemical polishing melts little of the surface of the silica film using a chemical which reacts with the silica surface. The chemical-mechanical polishing uses the mechanical polishing and chemical polishing simultaneously. For example, the chemical mechanical polishing chemically reacts an abrasive including KOH with the silica film, and at the same time mechanically polishes the surface of the silica film, to increase polishing efficiency. The surface of the silica film is polished to improve characteristics of an optical device, e.g., characteristics of cross talk if the surface of the silica film in the optical device is non-uniform.

As described above, according to the method for manufacturing a silica film of the present invention, using the apparatus for manufacturing the silica film of FIG. 1, wafers are supplied and thus processes are performed continuously in a deposition part, a calcination part and a sintering part. On the other hand, in the conventional art, a batch is deposited, then more wafers are mounted and the deposition system is stabilized, and then further deposition is performed. Thus, according to the method for manufacturing the silica film of the present invention, the process can be performed continuously, to thereby increase the productivity without pausing to load the wafers or stabilize the deposition part.

Also, since the process can be continuously performed, mass production of the silica film for manufacturing a silica optical device is possible. The process enhances the uniformity of the silica film and reduces the unit cost of production. Further, since the processing of the silica film is continuously performed, there is no need to expose the wafer to air after deposition of the silica soot, thereby suppressing deterioration of the silica film due to contamination and water.

What is claimed is:

1. An apparatus for manufacturing a silica film, the apparatus comprising:
    a conveyor including a mounting unit and onto which a plurality of wafers may be loaded, the conveyor moving and thereby moving and transferring the wafers on the conveyor through the apparatus;
    a deposition part located above the conveyor, including at least one torch for sustaining a flame, for depositing silica soot on the wafers located on the conveyor;
    a calcination part, adjacent to the deposition part for heating the silica soot to a calcination temperature to remove water from the silica soot deposited on the wafers; and
    a sintering part, adjacent to the calcination part, for heating the silica soot deposited on the wafers to a densification temperature, higher than the calcination temperature, densifying the silica soot to form a silica film on the wafers wherein the wafers are continuously moved from the deposition part, through the calcination part, and to the sintering part by the conveyor.

2. The apparatus of claim 1, wherein the mounting unit includes wafer shaped depressions in the conveyor.

3. The apparatus of claim 1, wherein the conveyor includes one selected from the group consisting of $Al_2O_3$, mullite, SiC, anode-oxidized $Al_2O_3$, and anode-oxidized tungsten.

4. The apparatus of claim 1, wherein the deposition part includes a plurality of torches supplied with a gaseous material to sustain flames and a transfer device for moving at least one of the torches relative to the conveyor.

5. An apparatus for manufacturing a silica film, the apparatus comprising:
    a conveyor including a mounting unit and onto which a plurality of wafers may be loaded, the conveyor moving and thereby moving and transferring the wafers on the conveyor through the apparatus;
    a deposition part located above the conveyor, including at least one torch for sustaining a flame, for depositing silica soot on the plurality of wafers located on the conveyor wherein the torch moves transverse to movement of the wafers on the conveyor;

a calcination part, adjacent to the deposition part, for heating the silica soot to a calcination temperature to remove water from the silica soot deposited on the wafers; and a sintering part, adjacent to the calcination part, for heating the silica soot deposited on the wafers to a densification temperature, higher than the calcination temperature, densifying the silica soot to form a silica film on the wafers wherein the wafers are continuously moved from the deposition part, through the calcination part, and to the sintering part by the conveyor.

* * * * *